United States Patent
You et al.

(10) Patent No.: US 12,170,203 B2
(45) Date of Patent: Dec. 17, 2024

(54) INTEGRATED CIRCUIT WITH CONDUCTIVE VIA FORMATION ON SELF-ALIGNED GATE METAL CUT

(71) Applicant: Taiwan Semiconductor Manufacturing Co., Ltd., Hsinchu (TW)

(72) Inventors: Jia-Chuan You, Hsinchu (TW); Chia-Hao Chang, Hsinchu (TW); Chu-Yuan Hsu, Hsinchu (TW); Kuo-Cheng Chiang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 387 days.

(21) Appl. No.: 17/581,787

(22) Filed: Jan. 21, 2022

(65) Prior Publication Data

US 2023/0023916 A1    Jan. 26, 2023

Related U.S. Application Data

(60) Provisional application No. 63/225,104, filed on Jul. 23, 2021.

(51) Int. Cl.
| | |
|---|---|
| *H01L 21/28* | (2006.01) |
| *H01L 21/02* | (2006.01) |
| *H01L 21/8234* | (2006.01) |
| *H01L 27/088* | (2006.01) |
| *H01L 29/06* | (2006.01) |
| *H01L 29/423* | (2006.01) |
| *H01L 29/66* | (2006.01) |
| *H01L 29/786* | (2006.01) |

(52) U.S. Cl.
CPC .... *H01L 21/28123* (2013.01); *H01L 21/0259* (2013.01); *H01L 21/823412* (2013.01); *H01L 21/823475* (2013.01); *H01L 21/823481* (2013.01); *H01L 27/088* (2013.01); *H01L 29/0665* (2013.01); *H01L 29/42392* (2013.01); *H01L 29/66742* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 9,236,267 B2 | 1/2016 | De et al. | |
| 9,502,265 B1 | 11/2016 | Jiang et al. | |
| 9,520,466 B2 | 12/2016 | Holland et al. | |
| 9,520,482 B1 | 12/2016 | Chang et al. | |

(Continued)

*Primary Examiner* — Nduka E Ojeh
(74) *Attorney, Agent, or Firm* — Seed IP Law Group LLP

(57) ABSTRACT

An integrated circuit includes a first nanostructure transistor having a first gate electrode and a second nanostructure transistor having a second gate electrode. A dielectric isolation structure is between the first and second gate electrodes. A gate connection metal is on a portion of the top surface of the first gate electrode and on a portion of a top surface of the second gate electrode. The gate connection metal is patterned to expose other portions of the top surfaces of the first and second gate electrodes adjacent to the dielectric isolation structure. A conductive via contacts the exposed portion of the top surface of the second gate electrode.

20 Claims, 12 Drawing Sheets

(56) References Cited

U.S. PATENT DOCUMENTS

| | | | |
|---|---|---|---|
| 9,536,738 B2 | 1/2017 | Huang et al. | |
| 9,576,814 B2 | 2/2017 | Wu et al. | |
| 9,608,116 B2 | 3/2017 | Ching et al. | |
| 9,786,774 B2 | 10/2017 | Colinge et al. | |
| 9,853,101 B2 | 12/2017 | Peng et al. | |
| 9,881,993 B2 | 1/2018 | Ching et al. | |
| 2019/0165045 A1* | 5/2019 | Chung | H10B 63/34 |
| 2022/0310818 A1* | 9/2022 | Sung | H01L 21/823878 |
| 2023/0019278 A1* | 1/2023 | Yeom | H01L 29/78618 |

* cited by examiner

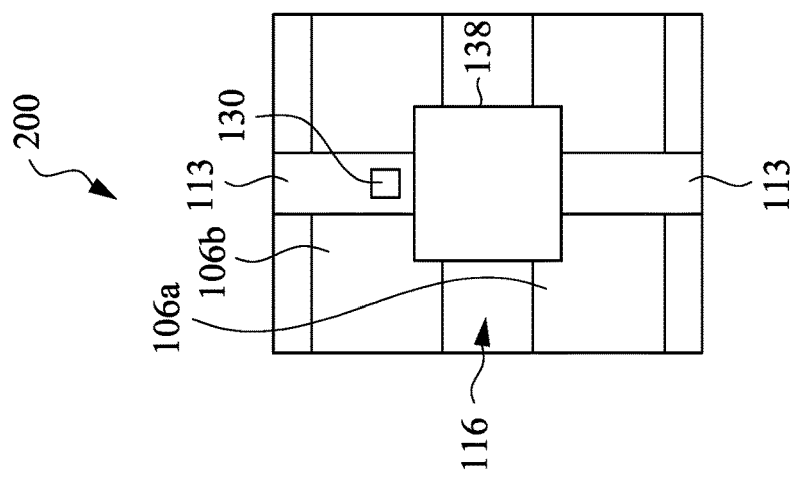
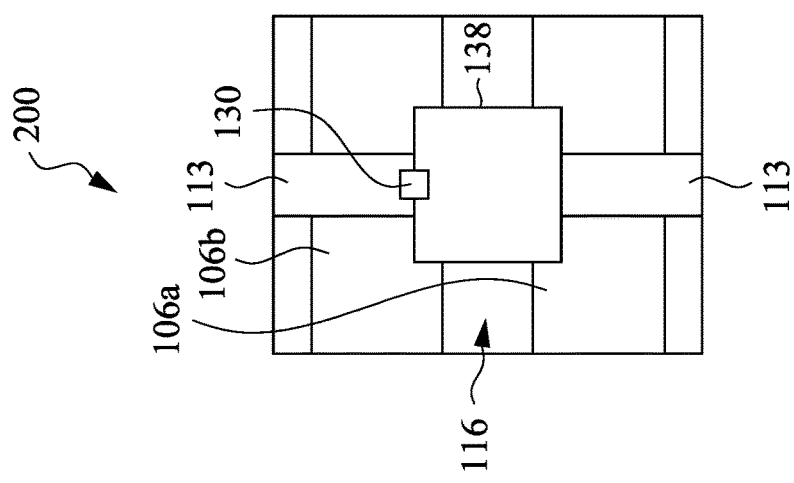
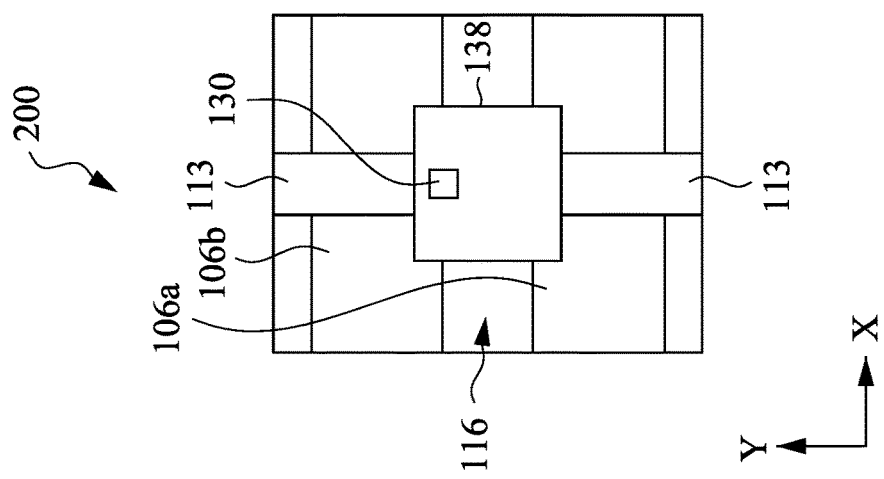

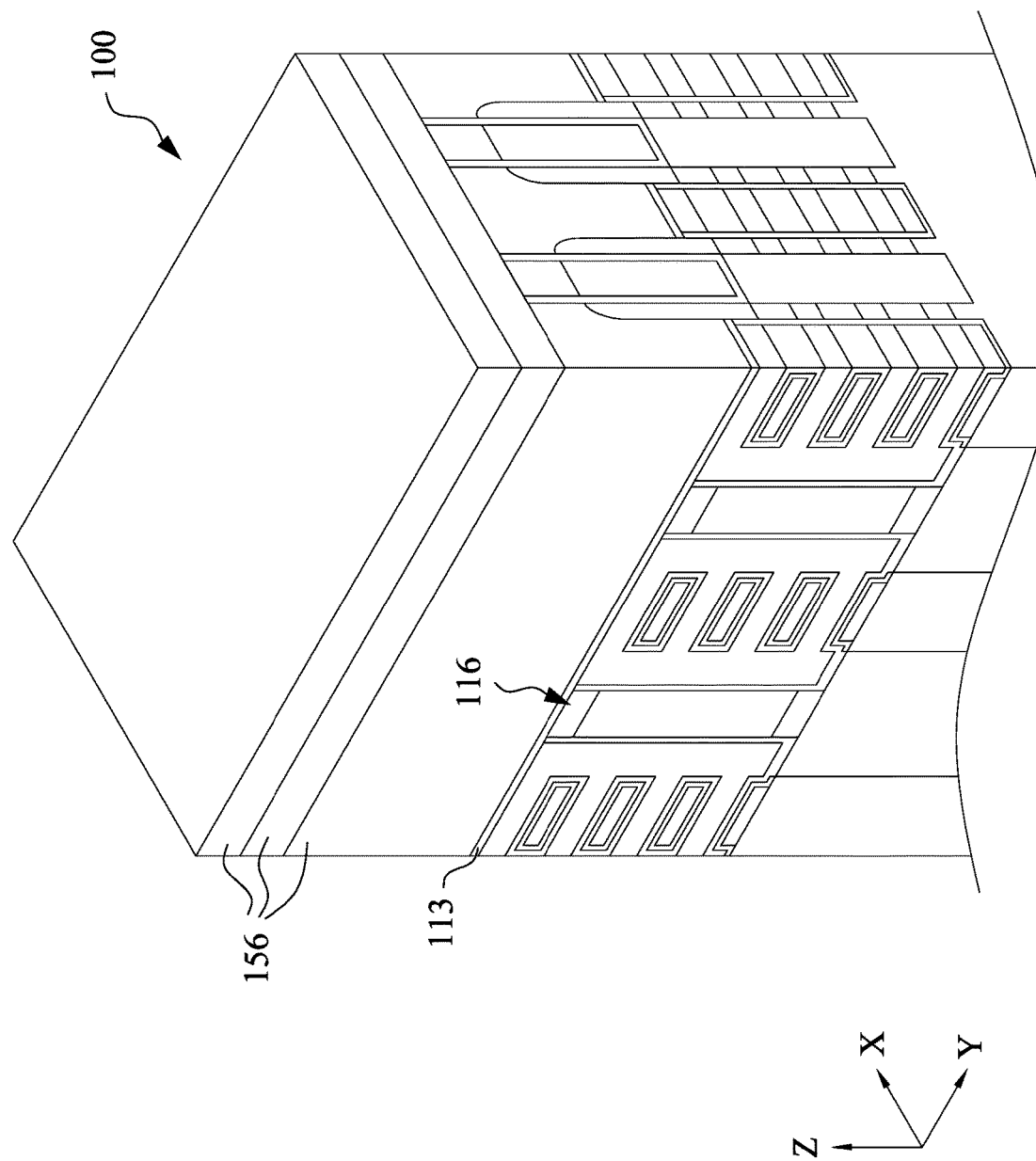

INTEGRATED CIRCUIT WITH CONDUCTIVE VIA FORMATION ON SELF-ALIGNED GATE METAL CUT

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase the computing power in integrated circuits is to increase the number of transistors and other integrated circuit features that can be included for a given area of semiconductor substrate.

Nanostructure transistors can assist in increasing computing power because the nanostructure transistors can be very small and can have improved functionality over conventional transistors. A nanostructure transistor may include a plurality of semiconductor nanostructures (e.g. nanowires, nanosheets, etc.) that act as the channel regions for a transistor.

Nanostructure transistors typically include a gate electrode that surrounds or is adjacent to the semiconductor nanostructures. As downward scaling continues, it can be difficult to form electrical connections to the gate electrodes of the nanostructure transistors

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2C are illustrations of layouts for an integrated circuit, in accordance with some embodiments.

FIGS. 3A-3I are perspective views of an integrated circuit at various stages of processing, in accordance with some embodiments.

DETAILED DESCRIPTION

Figure 1:
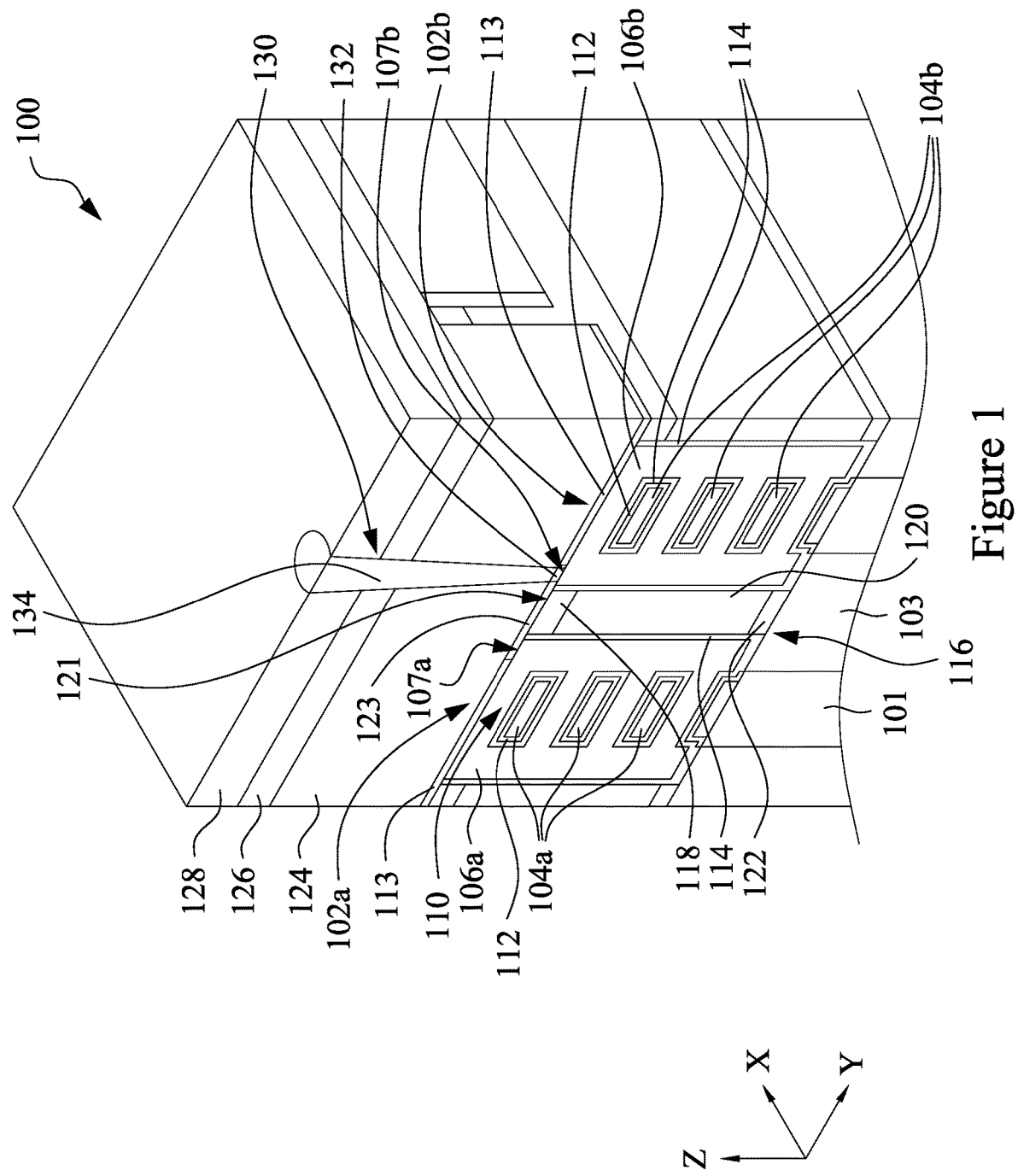
FIG. 1 is a perspective view of an integrated circuit, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit with nanostructure transistors having layouts that promote flexibility in providing connections to the gate electrodes of the nanostructure transistors. The gate electrodes of each nanostructure transistor includes a first gate metal that surrounds the semiconductor nanostructures. The gate electrodes of two adjacent nanostructure transistors are separated from each other by a dielectric isolation structure. The dielectric isolation structure is very narrow so that a relatively small distance laterally separates the gate electrodes of the two transistors. During fabrication, a second gate metal is formed on the top surfaces of both of the transistors. A gate cutting process is then performed to remove a portion of the second gate metal extending between the first gate metals of the two transistors. In particular, the cutting process removes the second gate metal from above the dielectric isolation structure and from portions of the top surfaces of the first gate metals of the two transistors. The cutting process electrically isolates the first gate electrode from the second gate electrode.

Because the dielectric isolation structure is very narrow, the etching window of the gate cutting process overlaps with the first gate metals of the two transistors, thereby exposing the top surfaces of the first gate metals of the two transistors adjacent to the dielectric isolation structure. The result is an increase in the flexibility with which conductive vias can be formed to connect with the gate electrodes of the two transistors. For example, the conductive vias can be formed overlapping the gate cutting window, or even entirely within the gate cutting window and still contact the first gate metal. This enables denser transistor formation and relaxed design rules for the formation of conductive vias. The result is higher performing integrated circuits, fewer scrapped wafers, and overall increased wafer yields.

FIG. 1 is a perspective view of an integrated circuit 100, in accordance with some embodiments. The integrated circuit 100 includes a substrate 101 and two transistors 102a and 102b over the substrate 101. As will be set forth in more detail below, the gate electrodes of the two transistors are formed in a manner that enables flexible design rules for the placement of conductive vias contacting the gate electrodes.

The transistors 102a and 102b may correspond to gate all around transistors. The gate all around transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the gate all around structure. Furthermore, the gate all around transistors 102a and 102b may each include a plurality of semiconductor nanostructures corresponding to channel regions of the transistors 102a and 102b. The nanostructures may include nanosheets, nanowires, or other types of nanostructures.

In some embodiments, the substrate 101 includes a single crystalline semiconductor layer on at least a surface portion. The substrate 101 may include a single crystalline semiconductor material such as, but not limited to Si, Ge, SiGe, GaAs, InSb, GaP, GaSb, InAlAs, InGaAs, GaSbP, GaAsSb and InP. In an example process described herein, the substrate 101 includes Si, though other semiconductor materials can be utilized without departing from the scope of the present disclosure.

The integrated circuit 100 includes shallow trench isolation regions 103. The dielectric material for the shallow trench isolation regions 103 may include silicon oxide, silicon nitride, silicon oxynitride, silicon oxycarbonitride, carbonitride, fluorine-doped silicate glass (FSG), or a low-K dielectric material. Other materials and structures can be utilized for the shallow trench isolation regions 103 without departing from the scope of the present disclosure.

The transistor 102a includes a plurality of semiconductor nanostructures 104a. The nanostructures 104a are stacked in the vertical direction. In the example of FIG. 1A, there are three stacked nanostructures 104a. However, in practice, there may be only two stacked nanostructures 104a or there may be more than three stacked nanostructures 104a without departing from the scope of the present disclosure. The nanostructures 104a correspond to channel regions of the transistor 102a.

The semiconductor nanostructures 104a may include one or more layers of Si, SiGe, or other semiconductor materials. Other semiconductor materials can be utilized for the semiconductor nanostructures 104a without departing from the scope of the present disclosure. In a non-limiting example described herein, the semiconductor nanostructures 104a are silicon. The vertical thickness of the semiconductor nanostructures 104a can be between 3 nm and 10 nm. The semiconductor nanostructures 104a may be separated from each other by 3 nm to 15 nm. Other thicknesses and materials can be utilized for the semiconductor nanostructures 104a without departing from the scope of the present disclosure.

The transistor 102a includes a gate metal 106a. The gate metal 106a surrounds the semiconductor nanostructures 104a. The gate metal 106a corresponds to a gate electrode, or may correspond to one of the metals that make up a gate electrode of the transistor 102a. The gate metal 106a can include one or more of titanium nitride, tungsten, tantalum, tantalum nitride, tantalum aluminum nitride, ruthenium, cobalt, aluminum, titanium, or other suitable conductive materials. The gate metal 106a has a top surface 107a. The top surface 107a is higher than the highest semiconductor nanostructure 104a. Other materials can be utilized for the gate metal 106a without departing from the scope of the present disclosure.

The transistor 102a includes a gate dielectric 110. The gate dielectric 110 is positioned between the gate metal 106a and the semiconductor nanostructures 104a. The gate dielectric 110 surrounds the semiconductor nanostructures 104a. The gate metal 106a surrounds the gate dielectric 110.

In some embodiments, the gate dielectric includes a low-K gate dielectric layer 112 and a high-K gate dielectric layer 114. The low-K gate dielectric layer 112 is in contact with the semiconductor nanostructures 104a. The high-K gate dielectric layer 114 is in contact with the low-K gate dielectric layer 112 and the gate metal 106a. The low-K gate dielectric layer 112 is positioned between the semiconductor nanostructures 104a and the high-K gate dielectric layer 114. The low-K gate dielectric layer 112 may be termed an interfacial gate dielectric layer.

The low-K gate dielectric layer 112 can include a dielectric material such as silicon oxide, silicon nitride, or other suitable dielectric materials. The low-K gate dielectric layer 112 can include a comparatively low-K dielectric with respect to high-K dielectric materials such as hafnium oxide or other high-K dielectric materials that may be used in gate dielectrics of transistors.

The high-K gate dielectric layer 114 includes one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$-$Al_2O_3$) alloy, other suitable high-k dielectric materials, and/or combinations thereof. The thickness of the high-k dielectric 114 is in a range from about 1 nm to about 3 nm. Other thicknesses, deposition processes, and materials can be utilized for the high-K gate dielectric layer 114 without departing from the scope of the present disclosure. The high-K gate dielectric layer 114 may include a first layer that includes HfO2 with dipole doping including La and Mg, and a second layer including a higher-K ZrO layer with crystallization.

The transistor 102a includes source/drain regions not shown in the view of FIG. 1. The source/drain regions are in contact with the semiconductor nanostructures 104a. The semiconductor nanostructures 104a extends in the X direction between the source/drain regions. The source/drain regions include a semiconductor material. The source/drain regions can be doped with N-type dopants species in the case of an N-type transistor. In the case of N-type transistors, the source/drain region can include Si, SiC, or other semiconductor materials. In the case of P-type transistors, the source/drain region can include Si, SiC, or other semiconductor materials. The source/drain regions can include other materials and structures without departing from the scope of the present disclosure.

The transistor 102a includes inner spacers not apparent in the view of FIG. 1. The inner spacers can include silicon oxide, silicon oxynitride, silicon carbonitride, silicon oxycarbonitride, FSG, a low-K dielectric material or other dielectric materials without departing from the scope of the present disclosure. The inner spacers physically separate the gate metal 106a from the source/drain regions. This prevents short circuits between the gate metal 106a and the source/drain regions. The inner spacers may have a thickness between 2 nm and 10 nm. Other materials, dimensions, and structures can be utilized for the inner spacers without departing from the scope of the present disclosure. The inner spacers may have a thickness between 2 nm and 10 nm.

The integrated circuit 100 includes a dielectric isolation structure 116. The dielectric isolation structure 116 is positioned between the gate metals 106a and 106b of the transistors 102a and 102b. The dielectric isolation structure 116 is also positioned between the semiconductor nanostructures 104a of the transistor 102a and the semiconductor nanostructures 104b of the transistor 102b. The dielectric isolation structure 116 is positioned in contact with the portions of the high-K gate dielectric layer 114 that align the outsides of the gate metals 106a and 106b. The dielectric isolation structure 116 may be termed a hybrid fin structure.

The hybrid fin structure includes a dielectric layer 120 and a dielectric layer 122. In some embodiments, the dielectric layer 120 includes silicon nitride. Alternatively, the dielectric layer 120 can also include silicon nitride, silicon oxynitride, silicon oxycarbide, silicon oxycarbonitride, FSG, a low-K dielectric material, or other suitable dielectric layers.

In some embodiments, the dielectric layer 122 includes silicon nitride. The dielectric layer 122 can include silicon oxide, silicon oxynitride, silicon oxycarbide, silicon oxycarbonitride, FSG, a low-K dielectric material, or other suitable dielectric layers. The dielectric layer 122 can be positioned on the shallow trench isolation region 103. The dielectric layer fills the space between the gate metals 106a and 106b.

The dielectric isolation structure 116 includes a dielectric layer 118 on the dielectric layer 120. The dielectric layer 118 has a top surface 121 substantially coplanar with the top surfaces 107a and 107b of the gate metals 106a and 106b. The top surface 121 of the dielectric layer 118 corresponds to the top surface of the dielectric isolation structure 116. The top surface 121 of the dielectric layer 118 may be positioned between 5 nm and 30 nm higher than the highest semiconductor nanostructure 104a and the highest semiconductor nanostructure 104b.

In some embodiments, the dielectric layer 118 is a high-K dielectric material. The dielectric layer 118 can include HfO2, HfSiO, HfSiON, HfTaO, HfTiO, HfZrO, zirconium oxide, aluminum oxide, titanium oxide, hafnium dioxide-alumina (HfO2-Al$_2$O$_3$) alloy, other suitable high-k dielectric materials, and/or combinations thereof. Alternatively, the dielectric layer 118 can include silicon nitride, silicon carbonitride, silicon oxynitride, silicon oxycarbonitride, or other suitable dielectric materials. The dielectric layer 118 may be termed a helmet layer for the dielectric isolation structure 116. Other materials and dimensions can be utilized for the dielectric layer 118 without departing from the scope of the present disclosure.

The integrated circuit 100 includes gate metal 113. The gate metal 113 is positioned on a portion of the top surface 107a of the gate metal 106a of the transistor 102a. The gate metal 113 is also positioned on a portion of the top surface 107b of the gate metal 106b of the transistor 102b. The gate metal 113 may include Ru, W, TiN, TaN, Co, Ti, TiAl, polysilicon or another suitable conductive material. The gate metal 113 may have a thickness between 2 nm and 20 nm. The gate metal 113 can include other materials and dimensions without departing from the scope of the present disclosure.

When the gate metal 113 is initially deposited, the gate metal 113 forms a contiguous conductive structure between the gate metals 106a and 106b across the top surface 121 of the dielectric isolation structure 116. In this circumstance, the gate metal 113 electrically connects the gate metal 106a of the transistor 102a to the gate metal 106b of the transistor 102b. More particularly, the gate metal 113 initially electrically connects the gate electrodes of a large number of transistors. However, in accordance with circuit design specifications, some of the gate electrodes should be electrically connected to each other by the gate metal 113 and other of the gate electrodes should be electrically isolated from each other. In the example FIG. 1, it is intended that the gate metal 106a be electrically isolated from the gate metal 106b. Accordingly, a gate cutting process is performed to electrically isolate the gate metal 106a from the gate metal 106b, and to electrically isolate the gate electrodes of the other transistors that design specifications indicate should be electrically isolated. The gate metal 113 may be termed a gate connection metal.

The gate cutting process may include an initial photolithography process. In the photolithography process a mask is formed including gate cut window. The gate cut window may be centered over the dielectric isolation structure 116. The gate cut window may have a width between 10 nm and 30 nm. The gate cutting process cuts or etches away the gate metal 113 in the gate cut window. The gap between the portion of the gate metal 113 on the gate metal 106a and the portion of the gate metal 113 on the gate metal 106b corresponds to the gate cutting window.

The gate isolation structure 116 may have a width in the Y direction between 10 nm and 30 nm. Due to the relatively narrow width of the gate isolation structure 116, the gate cutting window overlaps with the gate metals 106a and 106b on either side of the gate isolation structure. Accordingly, when the gate cutting process is performed, a portion of the top surface of the gate metal 106a is exposed by removal of the gate metal 113. A portion of the top surface 107b of the gate metal 106b is also exposed by removal of the gate metal 113.

Because the gate cutting window overlaps with the gate metals 106 and 106b, the placement window for conductive vias is more flexible. In particular, conductive vias can be placed overlapping the gate cutting window or even entirely within the gate cutting window over the exposed portions of the top surfaces 107a and 107b of the gate metals 106a and 106b.

The integrated circuit 100 includes a dielectric layer 123 positioned on the top surface 121 of the dielectric isolation structure 116 and on the exposed portions of the top surfaces 107a and 107b of the gate metals 106a and 106b. The dielectric layer 123 is in contact with the gate metal 113 over the gate metals 106a and 106b. The dielectric layer 123 can include can include silicon oxide, silicon nitride, silicon oxynitride, silicon oxycarbide, silicon oxycarbonitride, FSG, a low-K dielectric material, or other suitable dielectric layers.

The integrated circuit 100 includes a dielectric layer 124 positioned on the dielectric layer 123 and on the top surfaces of the gate metal 113. In practice, the dielectric layer 124 may be part of or one with the dielectric layer 123. The dielectric layer 124 can include can include silicon oxide, silicon oxynitride, silicon oxycarbide, silicon oxycarbonitride, FSG, a low-K dielectric material, or other suitable dielectric layers.

A dielectric layer 126 is positioned on the dielectric layer 124. The dielectric layer 126 can include can include silicon oxide, silicon oxynitride, silicon oxycarbide, silicon oxycarbonitride, FSG, a low-K dielectric material, or other suitable dielectric layers.

An interlevel dielectric layer 128 is positioned on the dielectric layer 126. The interlevel dielectric layer 128 can include can include silicon oxide, silicon oxynitride, silicon oxycarbide, silicon oxycarbonitride, FSG, a low-K dielectric material, or other suitable dielectric layers.

The integrated circuit 100 includes a conductive via 130 extending through the dielectric layers 128, 126, and 124 to the top surface 107b of the gate metal 106b. The conductive via 130 is formed within the gate cutting window. In particular, the conductive via 130 is formed within the portion of the gate cutting window that overlaps with the gate metal 106b. Accordingly, the bottom of the conductive via 130 is in direct contact with the portion of the top surface 107b of the gate metal 106b that was exposed during etching of the gate metal 113.

In some embodiments, the conductive via 130 includes a first metal layer 132. The first metal layer 132 is at the bottom of the conductive via 130 and is in direct contact with the top surface 107b of the gate metal 106b. The first metal layer 132 can include Ru, W, TiN, TaN, Co, Ti, TiAl, or other suitable conductive materials. The first metal layer 132 can include a material different from the material of the gate metal 113. The first metal layer 132 can have a thickness between 2 nm and 10 nm. It is possible that during the etching process of the gate metal 113, that a recess may be formed in the top surface 107a and 107b of the gate metals 106 and 106b. The recess is less than 2 nm. Though not shown in FIG. 1, a conductive via may also be formed in electrical contact with the gate metal 106a.

The transistor 102a can be operated by applying voltages to the source/drain regions and the gate metal 106a. The voltages can be applied to the source/drain regions via source/drain contacts (not shown). The voltages can be applied to the gate metal 106a by conductive vias. The voltages can be selected to turn on the transistor 102a or to turn off the transistor 102a. When the transistor 102a is turned on, currents may flow between the source/drain regions through each of the semiconductor nanostructures 104a. When the transistor 102a is turned off, currents do not flow through the semiconductor nanostructures 104a. The transistor 102b can be operated in substantially the same manner.

FIGS. 2A-2C are illustrations of layouts 200-204 for an integrated circuit 100, in accordance with some embodiments. The layout 200 corresponds to a top view of a layout for an integrated circuit 100. The layout 200 illustrates the position of the gate metal 113 overlying the gate metals 106a and 106b. The layout 200 also illustrates the position of the dielectric isolation structure 116 between the gate metals 106a and 106b. The layout 200 also illustrates a gate cutting window 138 utilized to remove a portion of the gate metal 113 to electrically isolate the gate metal 106a from the gate metal 106b. As described in relation to FIG. 1, the gate cutting window 138 overlies the dielectric isolation structure 116 and overlaps the gate metals 106a and 106b. The layout 200 also illustrates the position of a conductive via 130 positioned entirely within the gate cutting window 138 and also overlapping the gate metal 106b. Because the conductive via 130 overlaps the gate metal 106b, the position of the conductive via 130 may be allowed under the design rules for the integrated circuit 100.

The layout 202 is substantially similar to the layout 200 aside from the position of the conductive via 130. In the layout 202, the conductive via 130 overlaps the gate cutting window 138. This may also be an allowed position for the conductive via 130 under design rules for the integrated circuit 100.

The layout 204 is substantially similar to the layout 200, aside from the position of the conductive via 130. The conductive via 130 is positioned entirely outside the gate cutting window 138 in the layout 202. This may be an allowed position for the conductive via 130 under design rules for the integrated circuit 100.

Figure 3A:
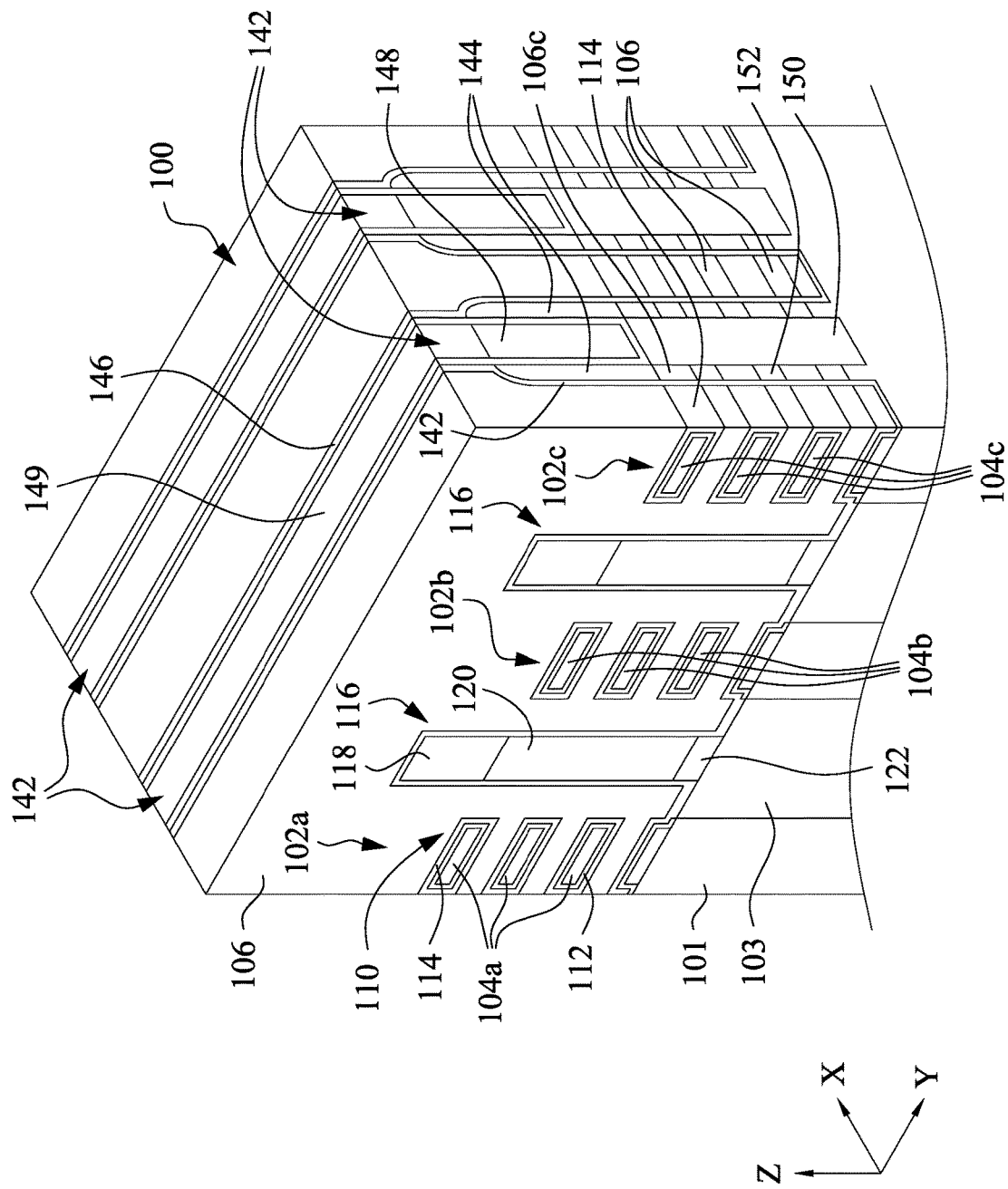

FIGS. 3A-3I are perspective views of an integrated circuit 100 at intermediate stages of processing, in accordance with some embodiments. FIG. 3A illustrates the positions of transistors 102a and 102b over a substrate 101. The substrate 101 can include materials as described in relation to FIG. 1.

FIG. 3A illustrates semiconductor nanostructures 104a and semiconductor nanostructures 104b of transistors 102a and 102b. The semiconductor nanostructures 104a and 104b can include materials and dimensions as described in relation to FIG. 1.

A gate dielectric 110 surrounds the semiconductor nanostructures 104a and 104b. The gate dielectric 110 includes a low-K gate dielectric layer 112 and the high-K gate dielectric layer 114. The low-K gate dielectric layer 112 and the high-K gate dielectric layer 114 can have materials and dimensions as described in relation to FIG. 1.

A gate metal 106 surrounds the semiconductor nanostructures 104a and 104b. The gate metal 106 is separated from the semiconductor nanostructures 104a and 104b by the gate dielectric 110. The gate metal 106 can include the same materials as described in relation to the gate metals 106a and 106b of FIG. 1.

A dielectric insulation structure 116 is positioned between the semiconductor nanostructures 104a of the transistor 102a and the semiconductor nanostructures 104b of the transistor 102b. The dielectric insulation structure 116 includes dielectric layers 118, 120, and 122. The dielectric layers 118, 120, and 122 can have materials as described in relation to FIG. 1. In FIG. 3A, the gate metal 106 overlies the dielectric isolation structures 116. The dielectric insulation structures 116 are positioned over trench isolation regions 103. The trench isolation regions 103 can have materials as described in relation to FIG. 1.

The view of FIG. 3A illustrates source/drain regions 150 of a third transistor 102c including semiconductor nanostructures 104c. The transistors 102a and 102b include source/drain regions 150 not visible in the view of FIG. 3A. The source/drain regions 150 can have materials substantially as described in relation to FIG. 1. The view of FIG. 3A also illustrates inner spacers 152 electrically isolating the source/drain regions 150 from the gate metal 106. The inner spacers 152 can have materials substantially as described in relation to FIG. 1. The semiconductor nanostructures 104c of the transistor 102c are in direct contact with the source/drain region 150.

The integrated circuit 100 includes dielectric fin structures 142 positioned over the source/drain regions 150 and extending in the Y direction the dielectric fin structures 142 include dielectric layers 146, 148, and 149. The dielectric layer 146 is a liner layer of the dielectric fin structures 142 and is in contact with the source/drain regions 150. The dielectric layer 146 can include silicon oxide, silicon oxynitride, silicon oxycarbide, silicon oxycarbonitride, FSG, a low-K dielectric material, or other suitable dielectric layers.

The dielectric layer 148 is positioned on and laterally bounded by the dielectric layer 146. The dielectric layer 148 can include silicon oxide, silicon oxynitride, silicon oxycarbide, silicon oxycarbonitride, FSG, a low-K dielectric material, or other suitable dielectric layers.

The dielectric layer 149 is positioned on the dielectric layer 148. The dielectric layer 149 is laterally bounded by the dielectric layer 146. The dielectric layer 149 can include silicon oxide, silicon oxynitride, silicon oxycarbide, silicon oxycarbonitride, FSG, a low-K dielectric material, or other suitable dielectric layers.

The integrated circuit 100 includes spacer layers 144 positioned on the sides of the dielectric fin structures 142. The spacer layers 144 can include silicon oxide, silicon oxynitride, silicon oxycarbide, silicon oxycarbonitride, FSG, a low-K dielectric material, or other suitable dielectric layers. As will be described in further detail below, the dielectric fin structures will eventually be replaced by source/drain contacts. The spacer layers 144 will serve to separate the source/drain contacts from other conductive structures.

Figure 3B:
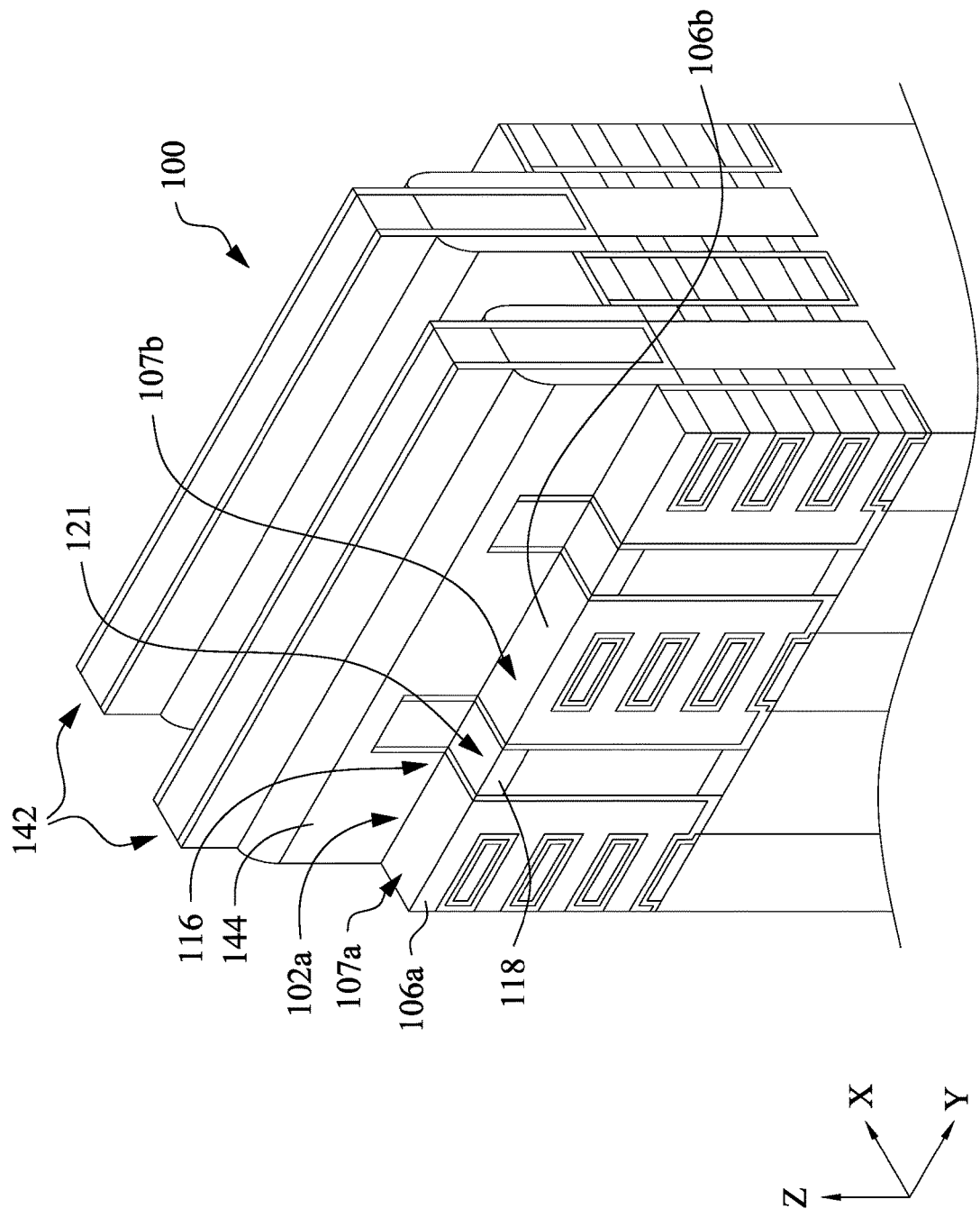

In FIG. 3B an etch-back process has been performed. The etch-back process etches back the gate metal 106. The etch-back process also etches back the top surface 121 of the dielectric isolation structure 116. The result of the etch-back process is that the gate metal 106a becomes electrically isolated from the gate metal 106b. The gate metal 106a is now separated from the gate metal 106b by the dielectric isolation structure 116. Furthermore, the top surface 107a of the gate metal 106a is substantially planar with the top surface 121 of the dielectric isolation structure 116 and the top surface 107b of the gate metal 106b. The etch-back process can be performed with one or more etching steps including one or more of a wet etch, a dry etch, or another etching process.

Figure 3C:
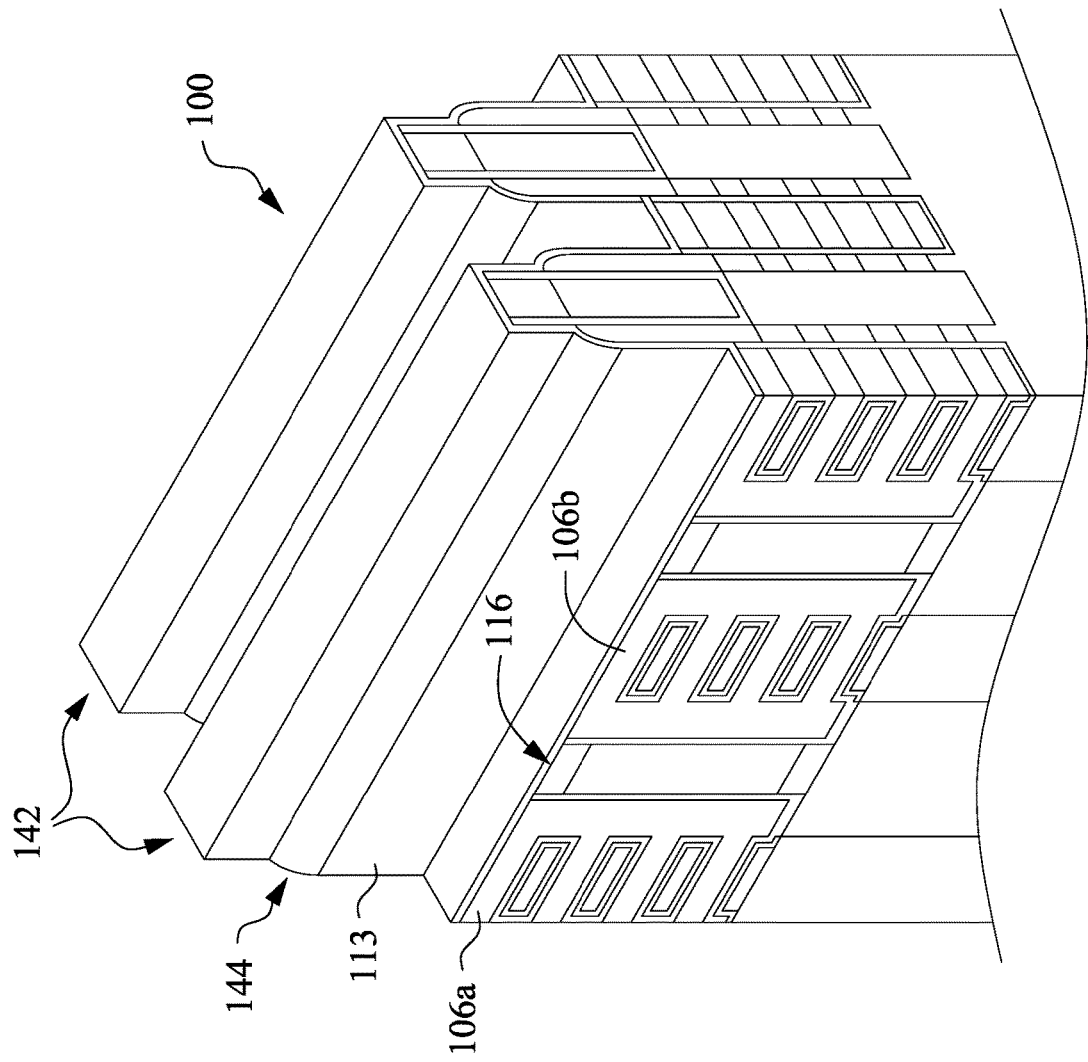

In FIG. 3C, a gate metal 113 has been deposited. The gate metal 113 is deposited in a blanket deposition process that causes the gate metal 113 to be deposited on all exposed surfaces of the integrated circuit 100. Accordingly, the gate metal 113 is deposited on the gate metal 106a, the dielectric isolation structure 116, the gate metal 106b, the dielectric fin structures 142, and the dielectric spacers 144. The material of the gate metal 113 can include the materials described in relation to FIG. 1. The gate metal 113 can be deposited by a physical vapor deposition process (PVD), an atomic layer deposition process (ALD), a chemical vapor deposition process (CVD), or other suitable processes.

Figure 3D:
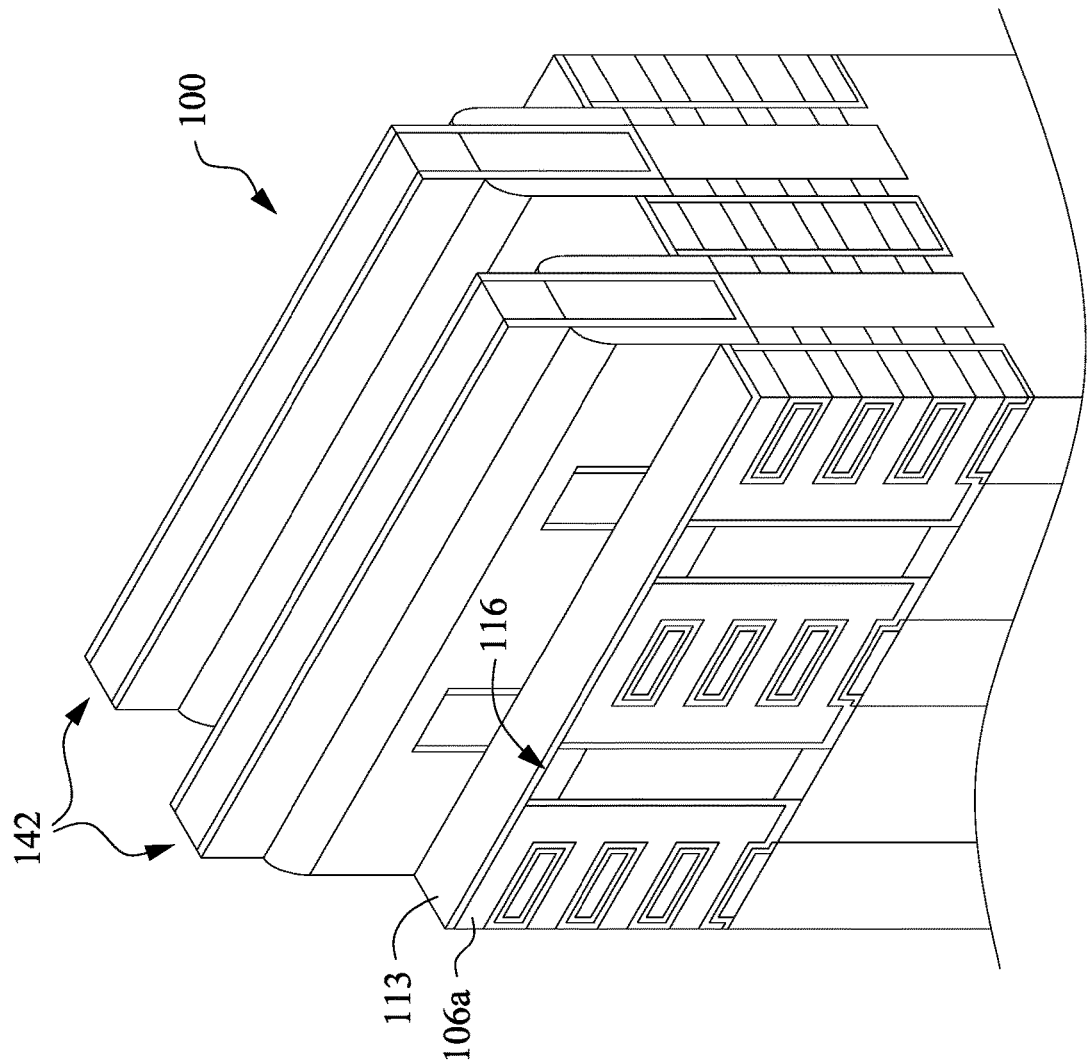

In FIG. 3D, an etch-back process has been performed. The etch-back process removes the gate metal 113 from vertical surfaces of the integrated circuit 100. The etch-back process also removes the gate metal 113 from the top surface of the dielectric fin structures 142. After the etch-back process, the gate metal 113 remains only on the top surfaces of the gate metal 106a and the dielectric isolation structure 116. The etch-back process can include one or more of a dry etch, a wet etch, or other etching processes.

In FIG. 3E one or more layers of photoresist 156 have been deposited on the integrated circuit 100. The photoresist 156 covers all exposed surfaces of the integrated circuit 100. The photoresist 156 can include a positive photoresist, a negative photoresist, or other types of photoresist. The photoresist 156 can be deposited in a spin on process or another suitable manner.

Figure 3F:
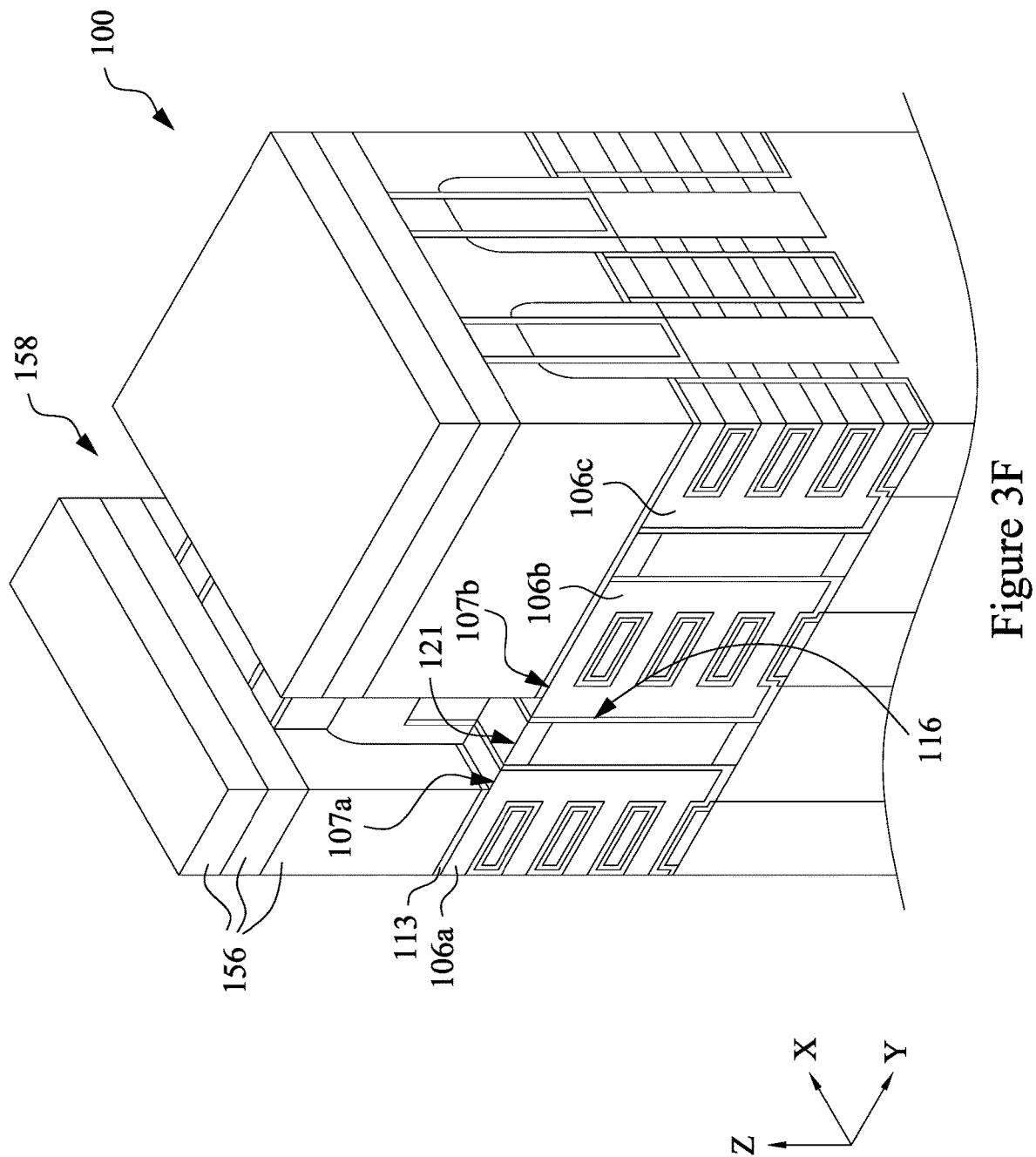

In FIG. 3F, a photolithography process has been performed. The photolithography process opens up a trench 158 in the layers of photoresist 156. The portion of the trench 158 directly above the dielectric isolation structure 116 corresponds to the gate cutting window 138 described in relation to FIGS. 1-2C. The gate cutting window 138 also overlaps with a portion of the top surfaces 107a and 107b of the gate metals 106a and 106b adjacent to the top surface 121 of the gate isolation structure 116.

After the photolithography process has patterned the photoresist 156, an etching process is performed to remove the portions of the gate metal 113 exposed in the gate cutting window 138. Accordingly, the etching process removes the gate metal 113 from the top surface 121 of the dielectric isolation structure 116. The etching process also removes the gate metal from portions of the top surfaces 107a and 107b of the gate metals 106a and 106b adjacent to the dielectric isolation structure 116. The etching process can include a wet etch, a dry etch, or other suitable etching processes. The etching process selectively etches the gate metal 113 with respect to the gate metal 106 such that the gate metal 106 acts as an etch stop for the gate metal 113. The gate metal 106 is substantially not etched by the etching process.

After the gate cutting process, the gate metal 106a of the transistor 102a is electrically isolated from the gate metal 106b of the transistor 102b. However, the gate metal 106b is still electrically connected to the gate metal 106c. This is because the gate metal 113 still extends across the dielectric isolation structure 116 between the gate metal 106b and the gate metal 106c. Accordingly, the gate metal 113 electrically connects the gate metal 106b with the gate metal 106c.

Figure 3G:
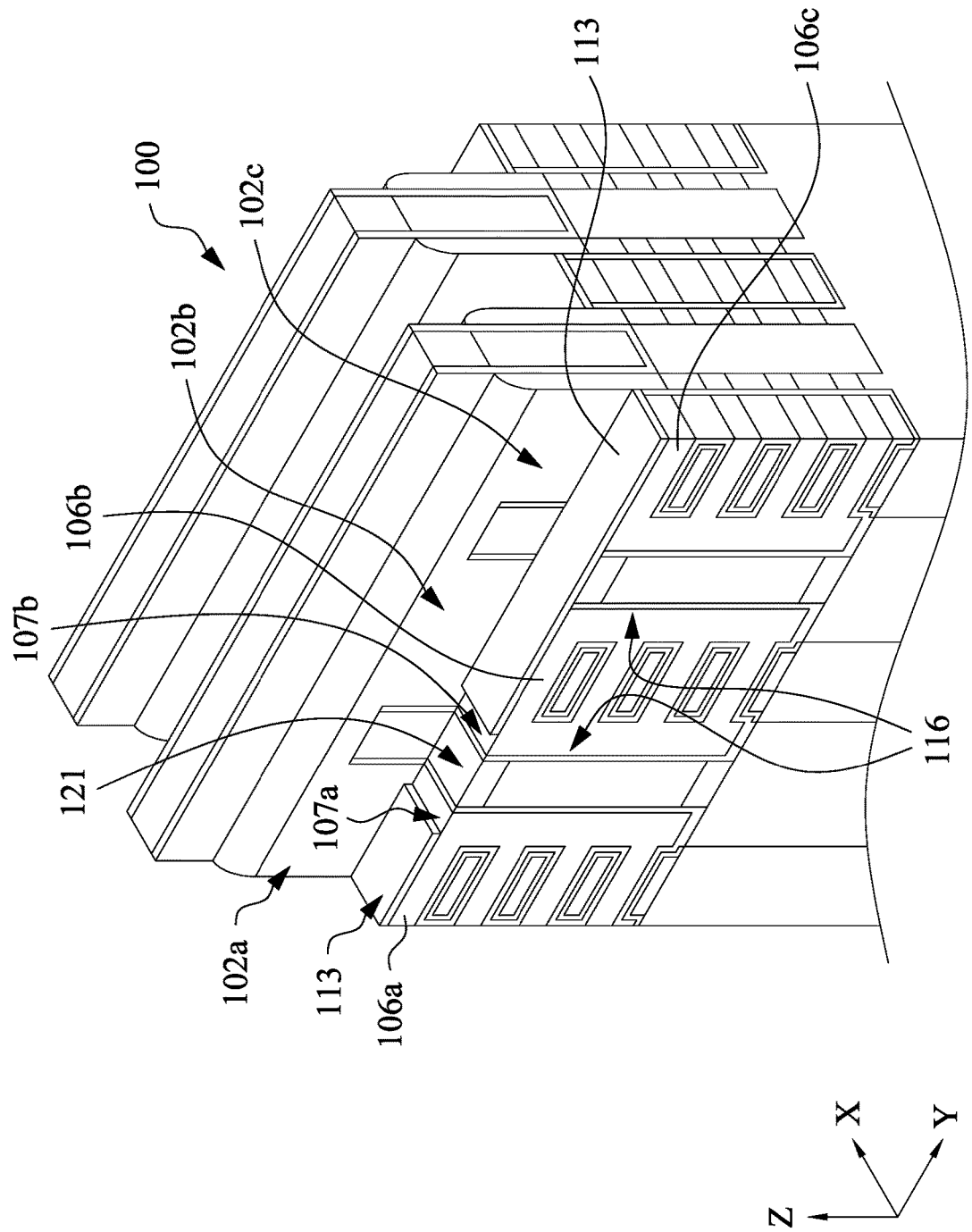

In FIG. 3G, the photoresist layers 156 have been removed. The photoresist layers 156 can be removed by an ashing process. Alternatively, the photoresist layers 156 can be removed by another suitable removal process.

Figure 3H:
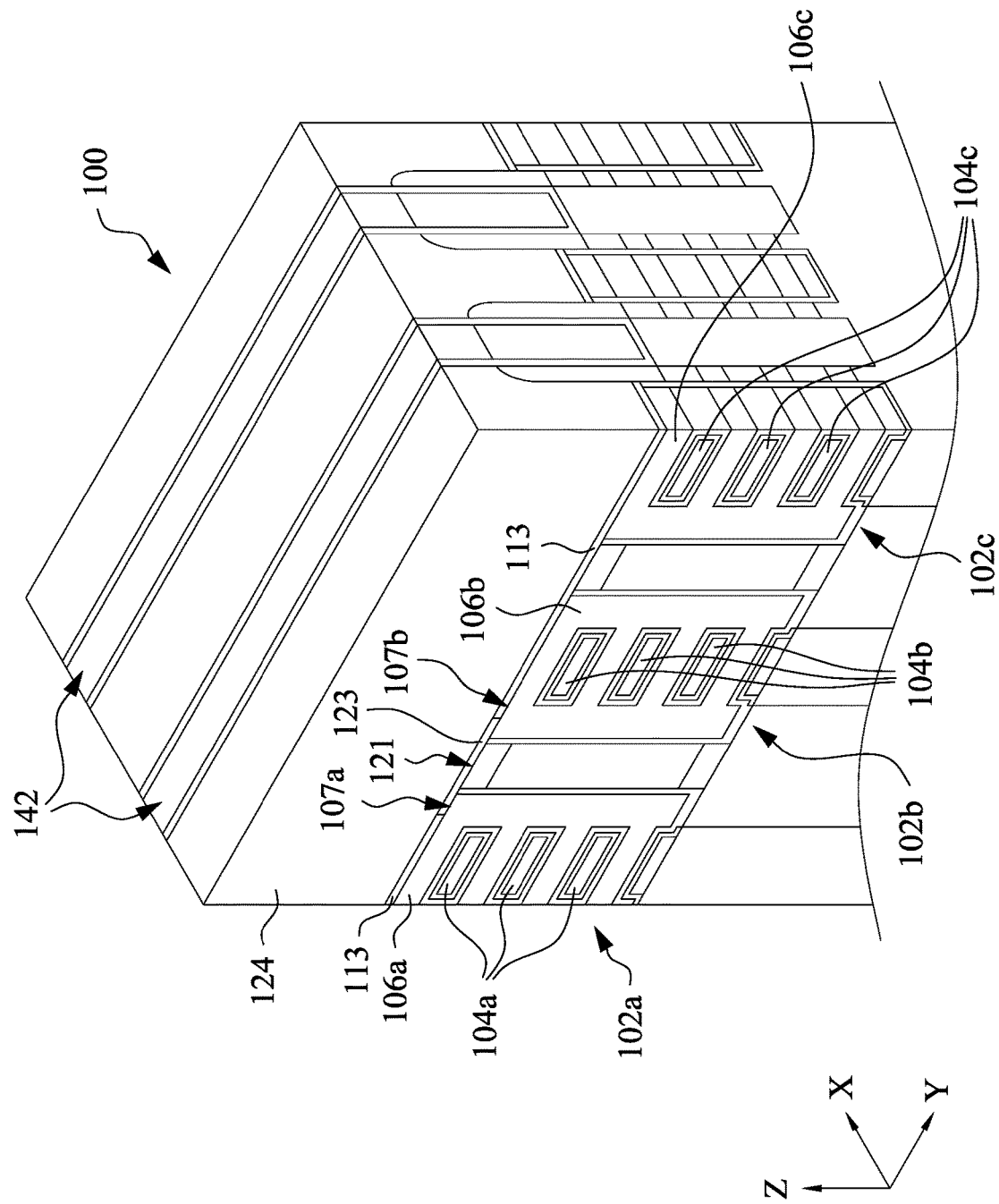

In FIG. 3H, a dielectric layer 123 has been deposited on the exposed portions of the top surfaces 107a, 107b, and 121 of the gate metals 106a, 106b, and the dielectric isolation structure 116. The dielectric layer 123 is in contact with the gate metal 113. The dielectric layer 123 can include silicon oxide, silicon oxynitride, silicon oxycarbide, silicon oxycarbonitride, FSG, a low-K dielectric material, or other suitable dielectric layers. The dielectric layer 123 can be deposited by CVD, ALD, PVD, or another suitable deposition process. The dielectric layer 124 has also been deposited. The dielectric layer 124 can include can include silicon oxide, silicon oxynitride, silicon oxycarbide, silicon oxycarbonitride, FSG, a low-K dielectric material, or other suitable dielectric layers and can be deposited by CVD, ALD, PVD, or another suitable deposition process. In practice, the dielectric layer 124 may be part of the dielectric layer 123. In other words, a single dielectric layer 123 may be deposited. After deposition of the dielectric layers 123 and 124, a chemical mechanical planarization (CMP) process is performed to planarize the top surfaces of the dielectric layer 124 and the dielectric fin structures 142.

Figure 3I:
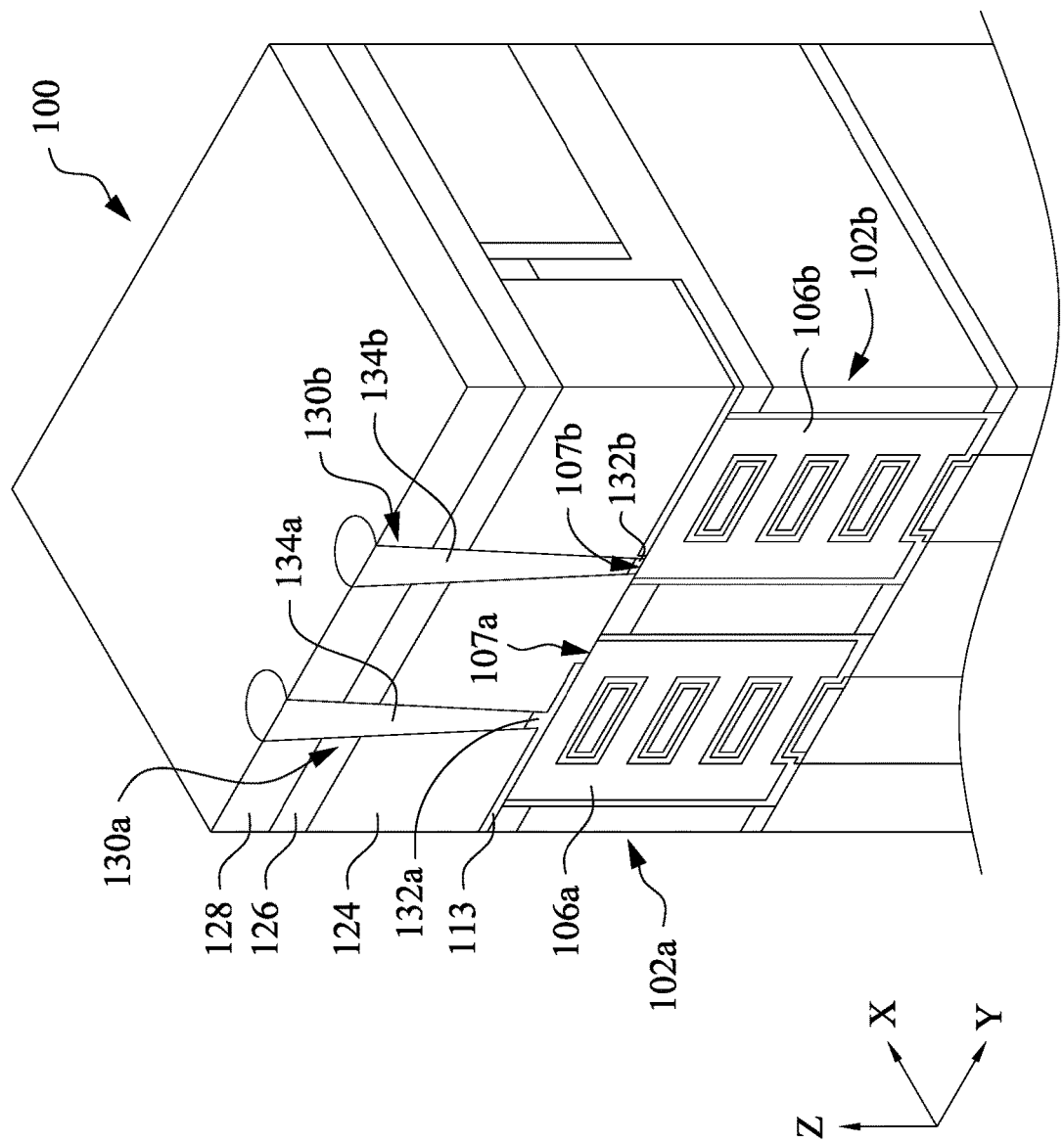

FIG. 3I is a perspective view of the integrated circuit 100 of FIG. 3H after some further processing steps have been performed. The view of FIG. 3I is taken to include only the transistors 102*a* and 102*b*. Accordingly, the transistor 102*c* is not apparent in the view of FIG. 3I. The integrated circuit and FIG. 3I corresponds to the integrated circuit 100 shown in FIG. 1, except that an additional conductive via has been formed, as will be described in more detail below.

In FIG. 3I, the dielectric layer 126 has been deposited on the dielectric layer 124. The interlevel dielectric layer 128 has been deposited on the dielectric layer 126. The materials of the dielectric layers 126 and 128 can be the same as described in relation to FIG. 1. The dielectric layers 126 and 128 can be deposited by CVD, ALD, PVD, or another suitable deposition process.

After deposition of the dielectric layers 126 and 128, conductive vias 130*a* and 130*b* are formed through the dielectric layers 128, 126, and 124. The conductive via 138 contacts the top surface of the gate metal 113 over the gate metal 106*a*. Accordingly, the conductive via 138 is electrically connected to the gate metal 106*a* of the transistor 102*a*. The conductive via 138 includes a first metal layer 132*a* and a second metal layer 134*a*. The materials and structure of the metal layers 132*a* and 134*a* are as described in relation to the conductive via 130 of FIG. 1. The metal layers 132*a* and 134*a* can be deposited by PVD, ALD, CVD, or other suitable deposition processes.

A conductive via 130*b* has also been formed through the dielectric layers 128, 126, and 124. The conductive via 130*b* corresponds to the conductive via 130 of FIG. 1. The conductive via 130*b* is in direct contact with the top surface 107*b* of the gate metal 106*b* of the transistor 102*b*. More particularly, the metal layer 132*b* is in direct contact with the gate metal 106*b* within the gate cutting window 138. The second metal layer 134*b* is positioned on the first metal layer 132*b*.

Though not shown in FIG. 3I, source/drain contacts can also be formed in conjunction with the processes that formed the conductive vias 130*a* and 130*b*. The source/drain contacts can be formed through the dielectric fin structures 142 to contact the source/drain regions 150 as described previously. At this stage, front end processing of the integrated circuit 100 is substantially complete, though other processes and combinations of processes can be utilized to form an integrated circuit 100 in accordance with principles of the present disclosure without departing from the scope of the present disclosure.

Figure 4:
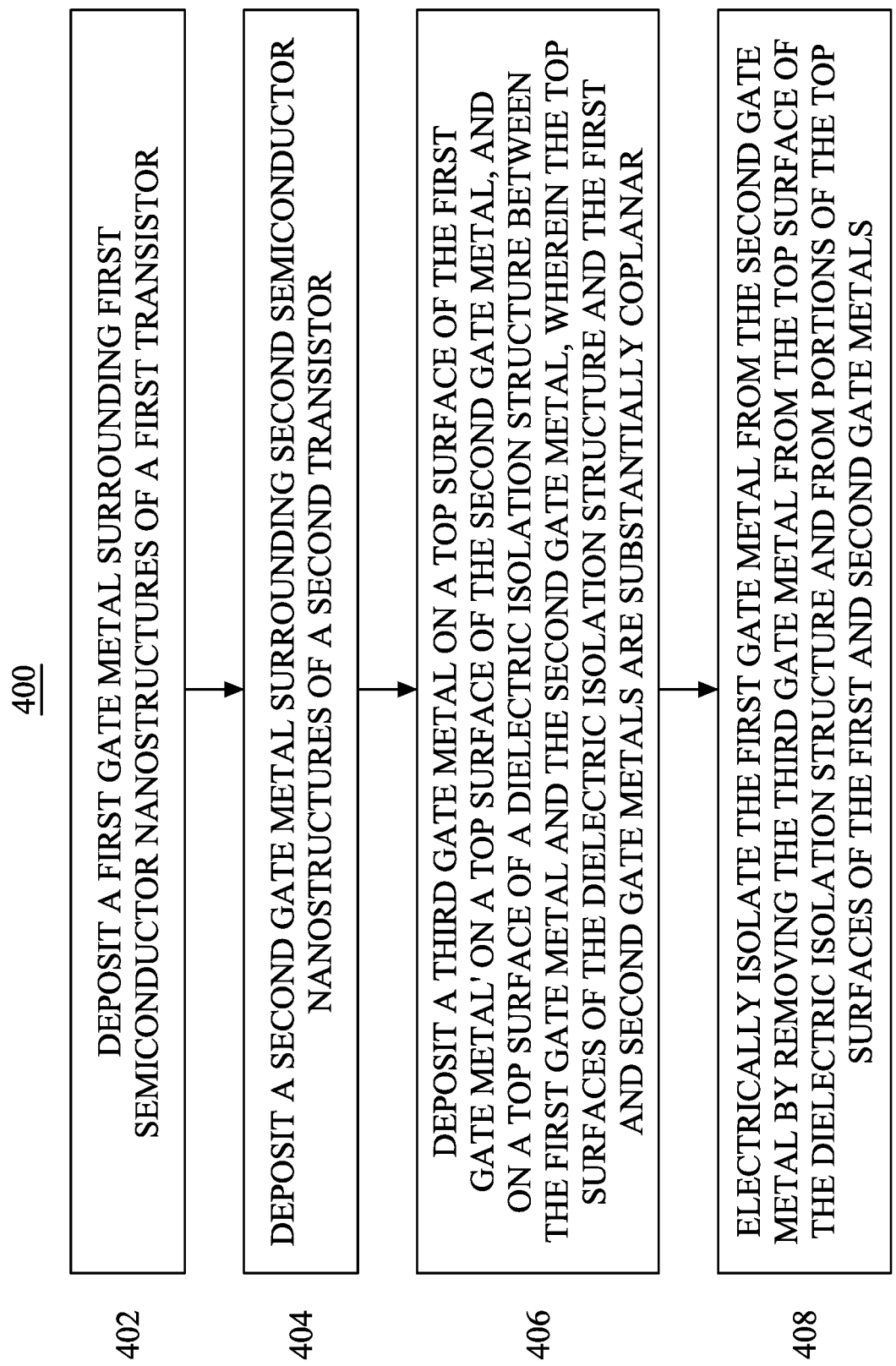
FIG. 4 is a flow diagram of a process for forming an integrated circuit, in accordance with some embodiments.

FIG. 4 is a flow diagram of a method 400 for forming an integrated circuit, in accordance with some embodiments. The method 400 can utilize processes, structures, and components described in relation to FIGS. 1A-3I. At 402, the method 400 includes depositing a first gate metal surrounding first semiconductor nanostructures of a first transistor. One example of a first gate metal is the gate metal 106*a* of FIG. 1. One example of first semiconductor nanostructures are the semiconductor nanostructures 104*a* of FIG. 1. At 404, the method 400 includes depositing a second gate metal surrounding second semiconductor nanostructures of a second transistor. One example of a second gate metal is the gate metal 106*b* of FIG. 1. One example of second semiconductor nanostructures are the semiconductor nanostructures 104*b* of FIG. 1. At 406, the method 400 includes depositing a third gate metal on a top surface of the first gate metal, on a top surface of the second gate metal, and on a top surface of a dielectric isolation structure between the first gate metal and the second gate metal, wherein the top surfaces of the dielectric isolation structure and the first and second gate metals are substantially coplanar. One example of a third gate metal is the gate metal 113 of FIG. 1. One example of a dielectric isolation structure is the dielectric isolation structure 116 of FIG. 1. At 408, the method 400 includes electrically isolating the first gate metal from the second gate metal by removing the third gate metal from the top surface of the dielectric isolation structure and from portions of the top surfaces of the first and second gate metals.

Embodiments of the present disclosure provide an integrated circuit with nanostructure transistors having layouts that promote flexibility in providing connections to the gate electrodes of the nanostructure transistors. The gate electrodes of each nanostructure transistor includes a first gate metal that surrounds the semiconductor nanostructures. The gate electrodes of two adjacent nanostructure transistors are separated from each other by a dielectric isolation structure. The dielectric isolation structure is very narrow so that a relatively small distance laterally separates the gate electrodes of the two transistors. During fabrication, a second gate metal is formed on the top surfaces of both of the transistors. A gate cutting process is then performed to remove a portion of the second gate metal extending between the first gate metals of the two transistors. In particular, the cutting process removes the second gate metal from above the dielectric isolation structure and from portions of the top surfaces of the first gate metals of the two transistors. The cutting process electrically isolates the first gate electrode from the second gate electrode.

Because the dielectric isolation structure is very narrow, the etching window of the gate cutting process overlaps with the first gate metals of the two transistors, thereby exposing the top surfaces of the first gate metals of the two transistors adjacent to the dielectric isolation structure. The result is an increase in the flexibility with which conductive vias can be formed to connect with the gate electrodes of the two transistors. For example, the conductive vias can be formed overlapping the gate cutting window, or even entirely within the gate cutting window and still contact the first gate metal. This enables denser transistor formation and relaxed design rules for the formation of conductive vias. The result is higher performing integrated circuits, fewer scrapped wafers, and overall increased wafer yields.

In some embodiments, a method includes includes depositing a first gate metal surrounding first semiconductor nanostructures of a first transistor and depositing a second gate metal surrounding second semiconductor nanostructures of a second transistor. The method includes depositing a third gate metal on a top surface of the first gate metal, on a top surface of the second gate metal, and on a top surface of a dielectric isolation structure between the first gate metal and the second gate metal. The top surfaces of the dielectric isolation structure and the first and second gate metals are substantially coplanar. The method includes electrically isolating the first gate metal from the second gate metal by removing the third gate metal from the top surface of the dielectric isolation structure and from portions of the top surfaces of the first and second gate metals.

In some embodiments, an integrated circuit includes a substrate and a first transistor over the substrate. The first transistor includes a plurality of stacked first semiconductor nanostructures corresponding to channel regions of the first transistor and a first gate metal surrounding the first semiconductor nanostructures and having a top surface. The integrated circuit includes a second transistor over the substrate. The second transistor includes a plurality of stacked second semiconductor nanostructures corresponding to channel regions of the second transistor and a second gate metal surrounding the second semiconductor nanostructures and having a top surface. The integrated circuit includes a first dielectric isolation structure between the first gate metal and the second gate metal and having a top surface substantially coplanar with a top surface of the first gate metal, a third gate metal on a first portion of the top surface of the first gate metal and on a first portion of the top surface of the second gate metal, and a dielectric layer on the top surface of the dielectric isolation structure, on a second portion of the top surface of the first gate metal, and on a second portion of the top surface of the second gate metal.

In some embodiments, an integrated circuit includes a first transistor including a first gate electrode having a top surface, a second transistor including a second gate electrode having a top surface, and a third transistor including a third gate electrode having a top surface. The integrated circuit includes a first dielectric isolation structure between the first gate electrode and the second gate electrode and having a top surface and a second dielectric isolation structure between the second gate electrode and the third gate electrode and having a top surface. The integrated circuit includes a gate connection metal in contact with the top surface of the first gate electrode, the top surface of the second gate electrode, the top surface of the third gate electrode, and the top surface of the second dielectric isolation structure, wherein the gate connection metal electrically connects the second gate electrode with the third gate electrode. The first gate electrode is electrically isolated from the second gate electrode. The integrated circuit includes a first conductive via in contact with the top surface of the second gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
 a substrate;
 a first transistor over the substrate and including:
  a plurality of stacked first semiconductor nanostructures corresponding to channel regions of the first transistor; and
  a first gate metal surrounding the first semiconductor nanostructures and having a top surface;
 a second transistor over the substrate and including:
  a plurality of stacked second semiconductor nanostructures corresponding to channel regions of the second transistor; and
  a second gate metal surrounding the second semiconductor nanostructures and having a top surface;
 a first dielectric isolation structure between the first gate metal and the second gate metal and having a top surface substantially coplanar with a top surface of the first gate metal;
 a third gate metal on a first portion of the top surface of the first gate metal and on a first portion of the top surface of the second gate metal; and
 a dielectric layer on the top surface of the dielectric isolation structure, on a second portion of the top surface of the first gate metal, and on a second portion of the top surface of the second gate metal, wherein the dielectric layer is in contact with the third gate metal above the first gate metal and above the second gate metal, wherein the first dielectric isolation structure is between each of the first semiconductor nanostructures and the second semiconductor nanostructures.

2. The integrated circuit of claim 1, further comprising:
 a third transistor including a fourth gate metal having a top surface substantially coplanar with the top surface of the first gate metal; and
 a second dielectric isolation structure positioned between the first gate metal and the fourth gate metal and having a top surface, wherein the third gate metal is on the top surface of the second dielectric isolation structure and on the top surface of the fourth gate metal and electrically connects the first gate metal with the fourth gate metal.

3. The integrated circuit of claim 1, further comprising a first conductive via contacting the top surface of the first gate metal.

4. The integrated circuit of claim 3, further comprising a second conductive via contacting a top surface of the third gate metal above the second gate metal.

5. The integrated circuit of claim 3, wherein the first conductive via includes:
 a first metal layer in contact with the first gate metal; and
 a second metal layer on the first metal layer.

6. The integrated circuit of claim 1, wherein the first dielectric isolation structure includes:
 a second dielectric layer between the first semiconductor nanostructures and the second semiconductor nanostructures; and
 a third dielectric layer on the second dielectric layer, wherein a top surface of the third dielectric layer is the top surface of the dielectric isolation structure.

7. The integrated circuit of claim 1, wherein the third gate metal is polysilicon.

8. The integrated circuit of claim 1, wherein the first gate metal and the second gate metal are a same material.

9. An integrated circuit, comprising:
 a first transistor including a plurality of stacked first channels and a first gate electrode surrounding the first stacked channels and having a top surface;
 a second transistor including a plurality of stacked second channels and a second gate electrode surrounding the second stacked channels and having a top surface;
 a third transistor including a third gate electrode having a top surface;
 a first dielectric isolation structure between the first gate electrode and the second gate electrode and having a top surface;
 a second dielectric isolation structure between the second gate electrode and the third gate electrode and having a top surface;
 a gate connection metal in contact with the top surface of the first gate electrode, the top surface of the second gate electrode, the top surface of the third gate electrode, and the top surface of the second dielectric isolation structure, wherein the gate connection metal electrically connects the second gate electrode with the third gate electrode, wherein the first gate electrode is electrically isolated from the second gate electrode;

a first dielectric layer in contact with the top surface of the first dielectric isolation structure, the top surface of the first gate electrode, the top surface of the second gate electrode. and a side surface of the gate connection metal; and a first conductive via in contact with the top surface of the second gate electrode wherein the first dielectric isolation structure includes:
- a second dielectric layer between the first semiconductor nanostructures and the second semiconductor nanostructures; and
- a third dielectric layer on the second dielectric layer, wherein a top surface of the third dielectric layer is the top surface of the dielectric isolation structure.

10. The integrated circuit of claim 9, wherein the top surfaces of the first gate electrode, the second gate electrode, and the first dielectric isolation structure are substantially coplanar.

11. The integrated circuit of claim 10, further comprising a second conductive via in contact with a top surface of the gate connection metal above the first transistor.

12. The integrated circuit of claim 11, wherein the dielectric layer is in contact with the gate connection metal above the first transistor and above the second transistor.

13. The integrated circuit of claim 9, wherein a top surface of the first dielectric layer and a top surface of the gate connection metal are substantially coplanar.

14. The integrated circuit of claim 9, wherein the gate connection metal is polysilicon.

15. The integrated circuit of claim 14, wherein the first gate electrode and the second gate electrode are a same material.

16. A method, comprising:
- depositing a first gate metal surrounding first semiconductor nanostructures of a first transistor;
- depositing a second gate metal surrounding second semiconductor nanostructures of a second transistor;
- depositing a third gate metal on a top surface of the first gate metal, on a top surface of the second gate metal, and on a top surface of a dielectric isolation structure between the first gate metal and the second gate metal, wherein the top surfaces of the dielectric isolation structure and the first and second gate metals are substantially coplanar; and
- electrically isolating the first gate metal from the second gate metal by removing the third gate metal from the top surface of the dielectric isolation structure and from portions of the top surfaces of the first and second gate metals.

17. The method of claim 16, further comprising depositing a dielectric layer on the top surface of the dielectric isolation structure and on the portions of the top surfaces of the first and second gate metals.

18. The method of claim 16, further comprising forming a first conductive via in contact with the top surface of the second gate metal.

19. The method of claim 18, further comprising forming a second conductive via in contact with the top surface of the third gate metal above the first gate metal.

20. The method of claim 19, wherein the third gate metal electrically connects the first gate metal to a fourth gate metal of a third transistor.

* * * * *